US006663294B2

(12) United States Patent
Crane, Jr. et al.

(10) Patent No.: US 6,663,294 B2
(45) Date of Patent: Dec. 16, 2003

(54) OPTOELECTRONIC PACKAGING ASSEMBLY

(75) Inventors: Stanford W. Crane, Jr., Santa Clara, CA (US); Zsolt Horvath, Fremont, CA (US)

(73) Assignee: Silicon Bandwidth, Inc., Fremont, CA (US)

( * ) Notice: Subject to any disclaimer, the term of this patent is extended or adjusted under 35 U.S.C. 154(b) by 61 days.

(21) Appl. No.: 09/940,649

(22) Filed: Aug. 29, 2001

(65) Prior Publication Data

US 2003/0044128 A1 Mar. 6, 2003

(51) Int. Cl.$^7$ ............................... G02B 6/42
(52) U.S. Cl. .......................................... 385/92
(58) Field of Search ................... 385/92–94

(56) References Cited

U.S. PATENT DOCUMENTS

| | | | |
|---|---|---|---|
| 5,005,178 A | * 4/1991 | Kluitmans et al. | 372/36 |
| 5,194,695 A | 3/1993 | Maslakow | |
| 5,202,943 A | * 4/1993 | Carden et al. | 385/92 |
| 5,248,901 A | 9/1993 | Temple | |
| 5,350,713 A | 9/1994 | Liang | |
| 5,572,065 A | 11/1996 | Burns | |
| 5,937,125 A | * 8/1999 | Creswick et al. | 385/88 |
| 6,227,724 B1 | 5/2001 | Verdiell | |
| 6,252,726 B1 | * 6/2001 | Verdiell | 385/92 X |

OTHER PUBLICATIONS

Patent application Ser. No. 09/946,682, filed Sep. 6, 2001, Crane, Jr., et al.
Patent application Ser. No. 09/946,553, filed Sep. 6, 2001, Crane, Jr., et al.
Patent application Ser. No. 09/946,554, filed Sep. 6, 2001, Crane, Jr., et al.

* cited by examiner

Primary Examiner—Hemang Sanghavi
Assistant Examiner—Mike Stahl
(74) Attorney, Agent, or Firm—McKenna Long & Aldridge LLP (57) ABSTRACT

Optoelectronic packaging assemblies for optically and electrically interfacing an electro-optical device to an optical fiber and to external circuitry. An optoelectronic packaging assembly includes a submount for holding an optical bench with an electro-optical device. Electrically conductive pins provide electrical contact to the electro-optical device. The optoelectronic packaging assembly includes an optical input receptacle for receiving an optical ferrule and an optical fiber. The optical input receptacle assists optical coupling of the electro-optical device to the optical fiber. The optoelectronic packaging assembly provides for cooling using a heat-sink or a thermal-electric-cooler. Beneficially, the optoelectronic packaging assembly is sealed using a cover.

71 Claims, 10 Drawing Sheets

OPTOELECTRONIC PACKAGING ASSEMBLY

BACKGROUND OF THE INVENTION

1. Field of the Invention

This invention relates to packaging assemblies for optoelectronic devices. More particularly, the present invention relates to optoelectronic packaging assemblies that provide for optical coupling to an optical fiber and for electrical connections to external components.

2. Discussion of the Related Art

Modern optoelectronic applications frequently involve analog or digital signal communication through optical fibers. Such applications typically include optoelectronic devices, such as laser diodes, LEDs, photodiodes, and phototransistors, as primary components. When using such optoelectronic devices it is often necessary to provide for optical coupling with an optical fiber and to provide for electrical connections to external components. For reliability, sealed packaging assemblies are usually used to mount the optoelectronic device, to protect them, and to assist implementation of the optical coupling and electrical connections.

Unfortunately, optoelectronic packaging has proven to be a demanding, difficult, and costly manufacturing task. One significant problem is coupling an optical fiber to an optoelectronic device with the required alignment accuracy and in such a way that the optical alignment is stable over both time and temperature. Manually aligning optical components is time consuming and costly. To assist optical alignment it is common to insert an optical-coupling ferrule between the optoelectronic component and the optical fiber. But, optical alignment remains a serious problem.

Another problem with optoelectronic packaging is the difficulty of removing heat from a packaged high-power optoelectronic device. For example, a laser diode can produce a significant amount of heat that must be removed quickly and efficiently to protect the laser diode.

Because of the foregoing, optoelectronic packaging assemblies generally have been relatively large, at least in comparison to non-opto semiconductor device packages. Furthermore, automated fabrication processes for use with optoelectronic packaging assemblies have been limited.

One optoelectronic package assembly that has been relatively successful is the so-called butterfly package. That package provides for input/output electrical connections along two sides, a high frequency circuit board for mounting an optoelectronic device and its associated components, and a tube for receiving an optical fiber. The tube enables an optical fiber and an optical ferrule to be located near the optoelectronic device, while the input/output lines enable electrical interconnections. Furthermore, additional mechanical components are required, for example, brackets that retain the optical fiber and ferrule in position.

While generally successful, the butterfly package is characterized by a large number of mechanical parts that must be assembled to a high degree of accuracy in a package that provides for poor access to internal components. Additionally, traditional butterfly packages are costly and inflexible to changes in their structure or configuration. Reference FIG. 1 and the associated detailed description that is provided subsequently.

Therefore, an optoelectronic packaging assembly that provides for input/output electrical connections, for easy mounting of an optoelectronic device and its associated components, for relatively simple, accurate and stable optical alignment, and for good thermal cooling would be beneficial.

SUMMARY OF THE INVENTION

The principles of the present invention provide for an optoelectronic packaging assembly with input/output electrical connections, easy mounting of an optoelectronic device, relatively simple, accurate and stable optical alignment between the optoelectronic device and an optical fiber, and good thermal cooling.

A first embodiment optoelectronic packaging assembly that is in accord with the principles of the present invention includes a submount having a cavity defined by a floor, sidewalls, a back wall, and a front wall. The sidewalls retain pins, while the front wall includes a protruding optical input receptacle. The submount fits on sidewalls of a base that includes a front wall with a slot. The base is configured such that the submount extends over the base sidewalls, and such that the optical input receptacle extends from the slot. An external cover fits over the submount.

A second embodiment optoelectronic packaging assembly that is in accord with the principles of the present invention includes a submount having sidewalls, a front wall, pins, protrusions, and an optical input receptacle. The protrusions are dimensioned to receive a printed circuit board. The front wall and the sidewalls define a cavity, and the sidewalls retain the pins. The optical input receptacle extends from the front wall. A bottom cover includes walls configured to receive the submount such that the submount and the bottom cover form an enclosed bottom cavity. Furthermore, the optical input receptacle extends from the bottom cavity. Additionally, a top cover is received on the submount. The top cover and the submount are configured such that the submount and the top cover form an enclosed top cavity.

A third embodiment optoelectronic packaging assembly that is in accordance with the principles of the present invention includes a base having a bottom wall and a front wall with a protruding optical input receptacle. A submount is attached to the bottom wall. Furthermore, a heat-sink mates with the base to form an enclosed volume. The heat-sink includes a top surface with a slot. An insert is in the slot. That insert includes pins that extend into the enclosed volume.

A fourth embodiment optoelectronic packaging assembly that is in accord with the principles of the present invention includes a base having a plate and a front wall with an optical input receptacle. A submount is attached to the plate. A printed circuit board having electrical contacts is on the submount. A heat-sink is in thermal communication with the plate. Pins of an insert electrically connect to the electrical contacts.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

BRIEF DESCRIPTION OF THE DRAWING

The accompanying drawings, which are included to provide a further understanding of the invention and are incorporated in and constitute a part of this specification, illustrate various embodiments of the invention and together with the descriptions of the embodiments serve to explain the principles of the invention. In the drawings.

DETAILED DESCRIPTION OF THE ILLUSTRATED EMBODIMENTS

References will now be made in detail to illustrated embodiments of the present invention, examples of which are illustrated in the accompanying drawings.

Figure 1:
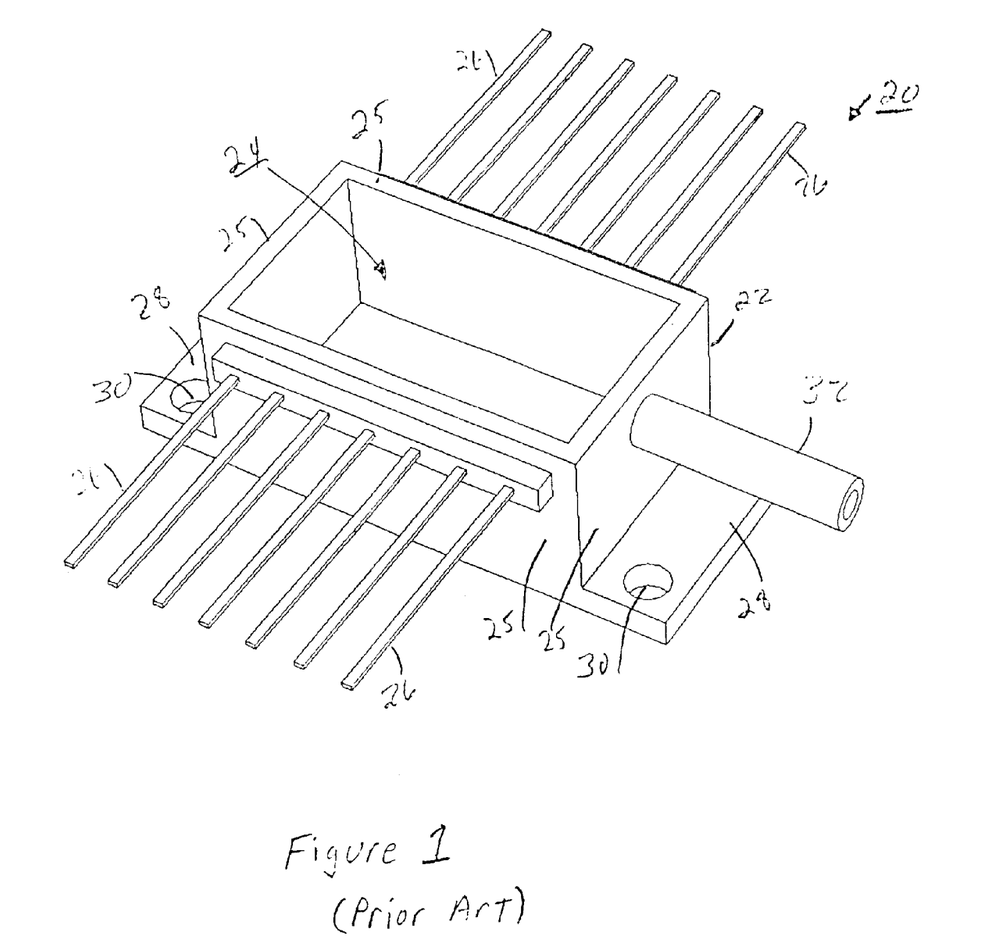
FIG. 1 is a simplified schematic view of a prior art butterfly optoelectronic packaging assembly.

FIG. 1 is a simplified schematic view of a prior art butterfly optoelectronic packaging assembly 20. As shown, that prior art package includes a body 22 having a cavity 24 that is defined between walls 25. The body 22 is typically comprised of KOVAR. The cavity 24 is dimensioned to receive an optoelectronic component or assembly, which is not shown. A plurality of pins 26 for making electrical connections between external electronics and a received optoelectronic component or assembly extends from two sides of the body 22. The body 22 further includes a mounting flange 28 having mounting holes 30. The mounting flange and holes are used to mount the optoelectronic packaging assembly 20 to an external structure. The body 22 also includes a fiber input receptacle 32 for receiving an optical fiber. Finally, while not shown for clarity, the optoelectronic packaging assembly 20 beneficially includes a cover for sealing the cavity 24.

The optoelectronic packaging assembly 20 typically takes the form of a standardized package. Among other factors, the pins 26 are formed into a standard footprint, and the mounting holes 30 and the receptacle 32 are located and dimensioned according to a predetermined configuration. This enables system designers to efficiently incorporate the optoelectronic packaging assembly 20 into their designs. Furthermore, a standard footprint enables the use of standardized optoelectronic workbenches and assembly machines to mount optoelectronic components or assemblies into the optoelectronic packaging assembly 20, to align an optical fiber with the mounted optoelectronic components or assemblies, and to electrically interconnect the optoelectronic components or assemblies to the pins 26.

While the optoelectronic packaging assembly 20 is generally functional, it suffers from at least four significant limitations. First, such optoelectronic packaging assemblies generally have poor heat dissipation characteristics. Second, the walls 25 tend to be relatively high, thus increasing the difficulty of mounting and then electrically and optically interconnecting a contained optoelectronic component or assembly. Third, with such optoelectronic packaging assemblies it can be very difficult to optically align a contained optoelectronic component with an optical fiber in three dimensions. Furthermore, these packages are very costly.

Figure 2:
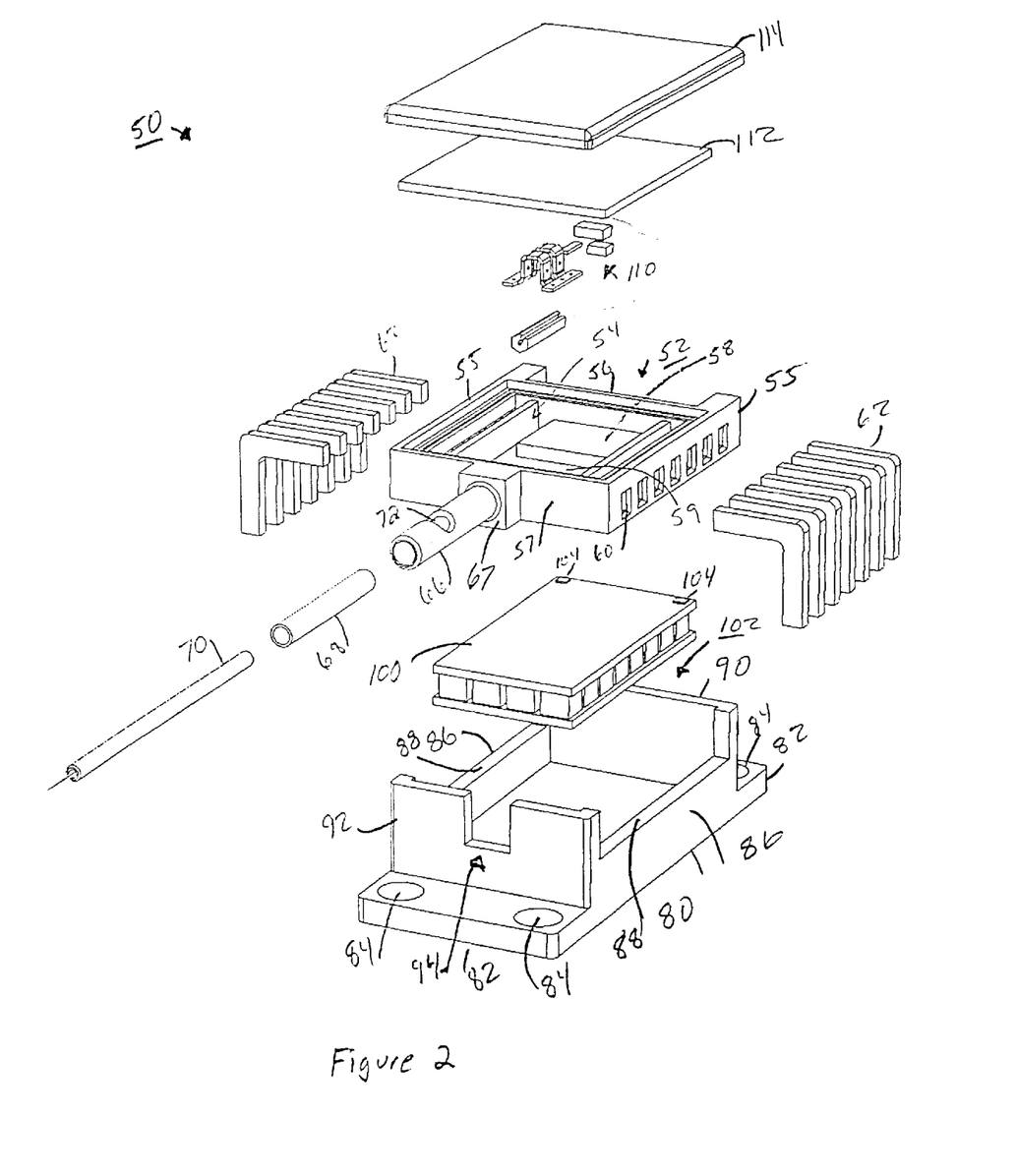
FIG. 2 is a blow-up of a first embodiment optoelectronic packaging assembly that is in accord with the principles of the present invention.

FIG. 2 illustrates a first embodiment optoelectronic packaging assembly 50 that addresses limitations of the prior art optoelectronic packaging assembly 20. As shown in FIG. 2, the optoelectronic packaging assembly 50 includes a submount 52 having a cavity 54 defined between (a) sidewalls 55, (b) a back wall 56, (c) a front wall 57, and (d) a floor 59. The sidewalls 55 each include a plurality of openings 60 for a plurality of pins 62. Typically, the submount 52 is molded from a liquid crystal polymer (such as VECTRA) but may also contain plating such as gold, nickel or aluminum for shielding or sealing. Furthermore, as shown in FIG. 2, the openings 60 and pins 62 have rectangular cross-sections.

Inside the cavity 54 is a raised mount 58. The raised mount 58 is configured to receive an optoelectronic device or assembly (shown in FIG. 2 in miscellaneous components 110, and subsequently described in more detail). Beneficially, the pins 62 are insert molded in the submount 52, or are pushed into the openings 60. If pushed into the openings 60, the openings can be beneficially sealed with a sealant. In any event, the pins 62 assist electrical connections between external electronics and the internal optoelectronic component or assembly. Furthermore, the pins 62 are beneficially formed into a "standard footprint" such that the optoelectronic packaging assembly 50 can mount interchangeably with the optoelectronic packaging assembly 20.

The submount 52 also includes a protruding optical input receptacle 66, which extends from a block structure 67 of the front wall 57. The optical input receptacle 66 is for receiving an optical ferrule 68 that mates with an optical fiber 70. The optical ferrule surrounds the optical fiber and assist alignment of that fiber. The optical input receptacle 66 includes a "half-moon" shaped slot 72 that is described in more detail with respect to FIG. 10.

The submount 52 is dimensioned to fit onto a base 80. The base 80 includes mounting flanges 82 having mounting holes 84 for mounting the optoelectronic packaging assembly 50 to an external structure. The base 80 further includes "low boy" sidewalls 86 having top surfaces 88, a back wall 90, and a front wall 92 with a slot 94. The sidewalls 86 are dimensioned to receive the submount 52 on the surfaces 88 such that the sidewalls 55 protrude from the base. Furthermore, the slot 94 is dimensioned to receive the block structure 67. Typically, the base 80 is molded from a liquid crystal polymer (such as VECTRA). Furthermore, the mounting holes 84 are beneficially formed with a "standard footprint" such that the optoelectronic packaging assembly 50 mounts interchangeably with the optoelectronic packaging assembly 20. Of course, other footprints are also possible.

Still referring to FIG. 2, an optional thermal-electric-cooler 100 (TEC), which beneficially includes a Peltier element, can cool the optoelectronic device or assembly. In such cases the base 80 includes a cavity 102 dimensioned to receive the thermal-electric-cooler 100. That cooler includes connectors 104 for receiving power. Those connectors are electrically connected to pins 62 such that external power can be applied to the thermal-electric-cooler 100.

Still referring to FIG. 2, the optoelectronic packaging assembly 50 also includes miscellaneous components 110 (including an optoelectronic component or assembly) that are described in more detail subsequently. Additionally, a lower cover 112 fits inside the submount 52, and an external cover 114 fits over the remainder of the optoelectronic packaging assembly 50.

FIG. 2 illustrates an advantage of the optoelectronic packaging assembly 50. Such assemblies can include a thermal-electric-cooler 100 (TEC) that can significantly improve heat dissipation.

Figure 3:
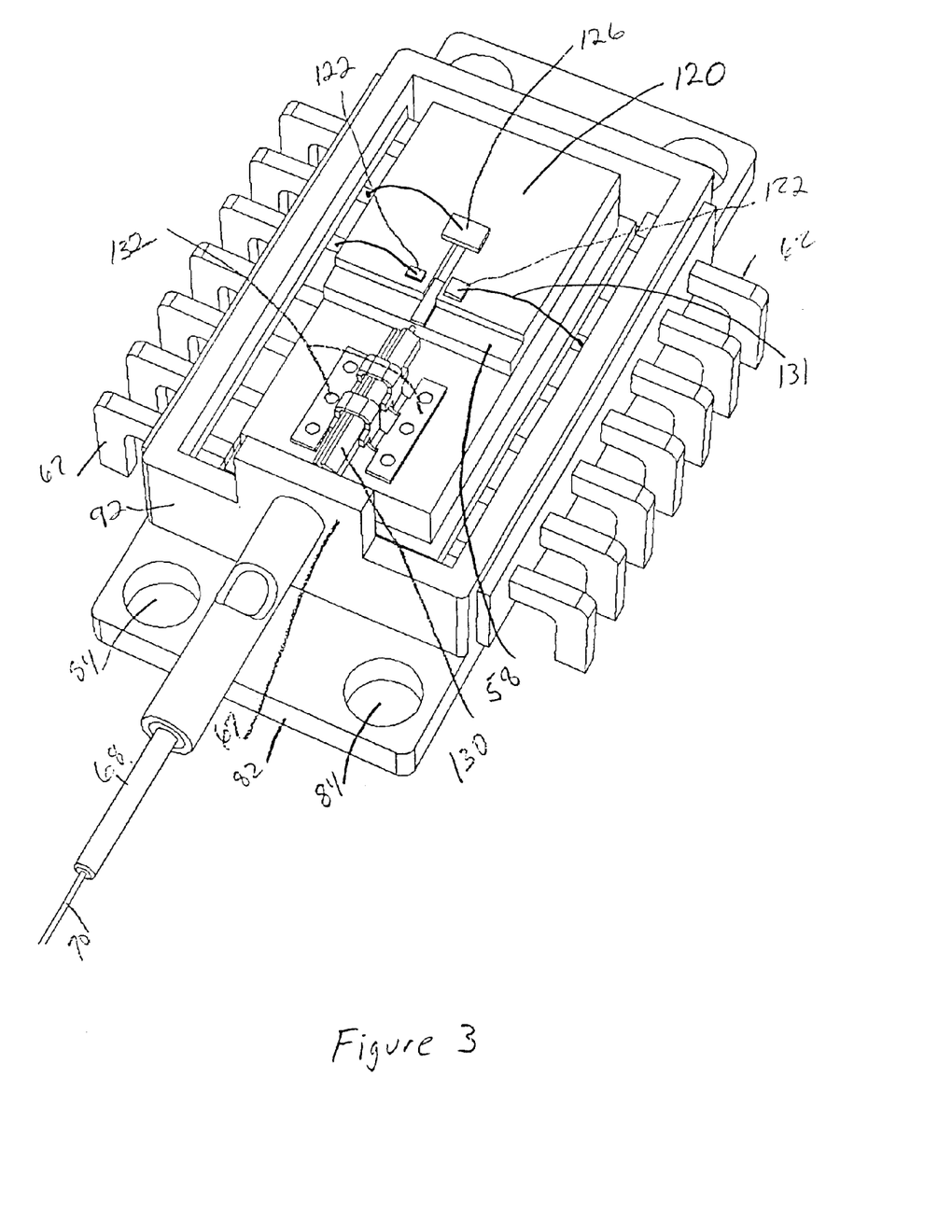
FIG. 3 is a schematic perspective view of a partially assembled first embodiment optoelectronic packaging assembly with the cover removed.

FIG. 3 illustrates a partially assembled first embodiment optoelectronic packaging assembly 50. As shown, the pins 62 fit into the submount 52 (via the openings 60), and the submount is fitted to the base 80 such that the block structure 67 fits into the slot 94 (reference FIG. 2). An optical bench (or substrate) 120 is located on the raised mount 58. The optical bench 120, which is beneficially comprised of a ceramic, silicon, or diamond, includes components 122 (such as resistors or capacitors) and an electro-optic device 126 (such as a laser diode or LED). The electro-optic device could be either an emitter or detector and of either a vertical or an edge type. The optical ferrule 68 inserts through the optical fiber input receptacle 66, while the optical fiber 70 inserts into the optical ferrule 68.

Still referring to FIG. 3, the optical ferrule 68 is optically aligned with the electro-optic device 126 such that an efficient optical coupling is made between the electro-optic device 126 and the optical fiber 70. Assisting the optical alignment is an optical spacer 130. The optical spacer is configured to retain and hold the optical ferrule such that optical ferrule is located on the same plane as the electro-optic device 126. The optoelectronic package 50 further includes clamps 132 for retaining the optical spacer 130 in place. Finally, wire bonded conductors 131 electrically interconnect the pins 62, the components 122, and the electro-optic device 126. The optical bench (substrate) 120, the components 122, the electro-optic device 126, the optical spacer 130, the conductors 131, and the clamps 132 are part of the miscellaneous components 110 shown in FIG. 2.

FIG. 3 illustrates advantages of the optoelectronic packaging assembly 50. First, the "low boy" sidewalls 86 enable ready access to the internal structures and components. This simplifies the mounting of the optical bench 120 and the interconnecting of that board and its components to the pins 62. Furthermore, the raised mount 58 and optical spacer 130 assist alignment of the optical ferrule with the electro-optic device 126.

Figure 4:
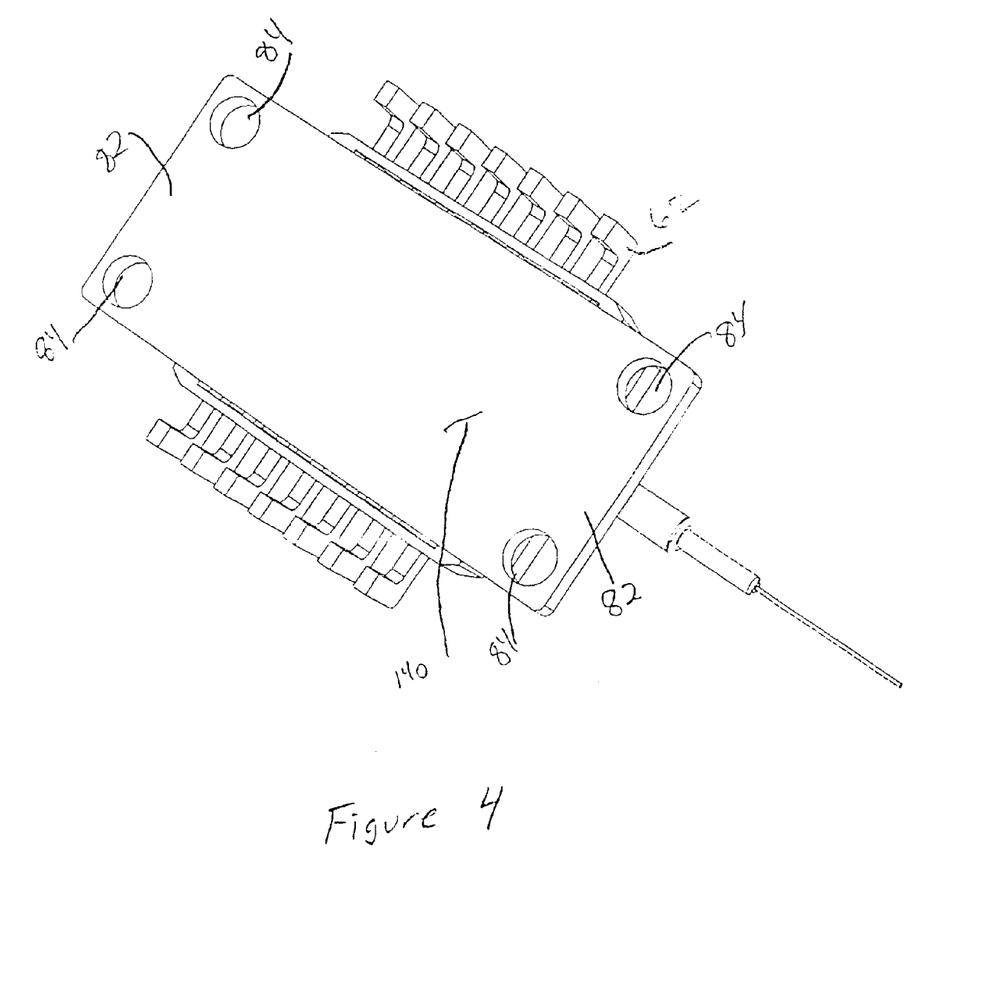
FIG. 4 is a bottom view of the first embodiment optoelectronic packaging assembly.

Turn now to FIG. 4 for a bottom view of the optoelectronic package 50. As shown, the base 80 and its mounting flanges 82 provide a flat bottom surface 140. The bottom can also be of a different structure incorporating details to increase surface area for increased thermal efficiency. This enables efficient heat transfer to an external structure, something that is particularly important if a TEC 100 is not used. Again, the footprint of the optoelectronic packaging assembly 50, including that of the pins 62 and mounting holes 64, is beneficially the same as that of the optoelectronic packaging assembly 20.

Figure 5:
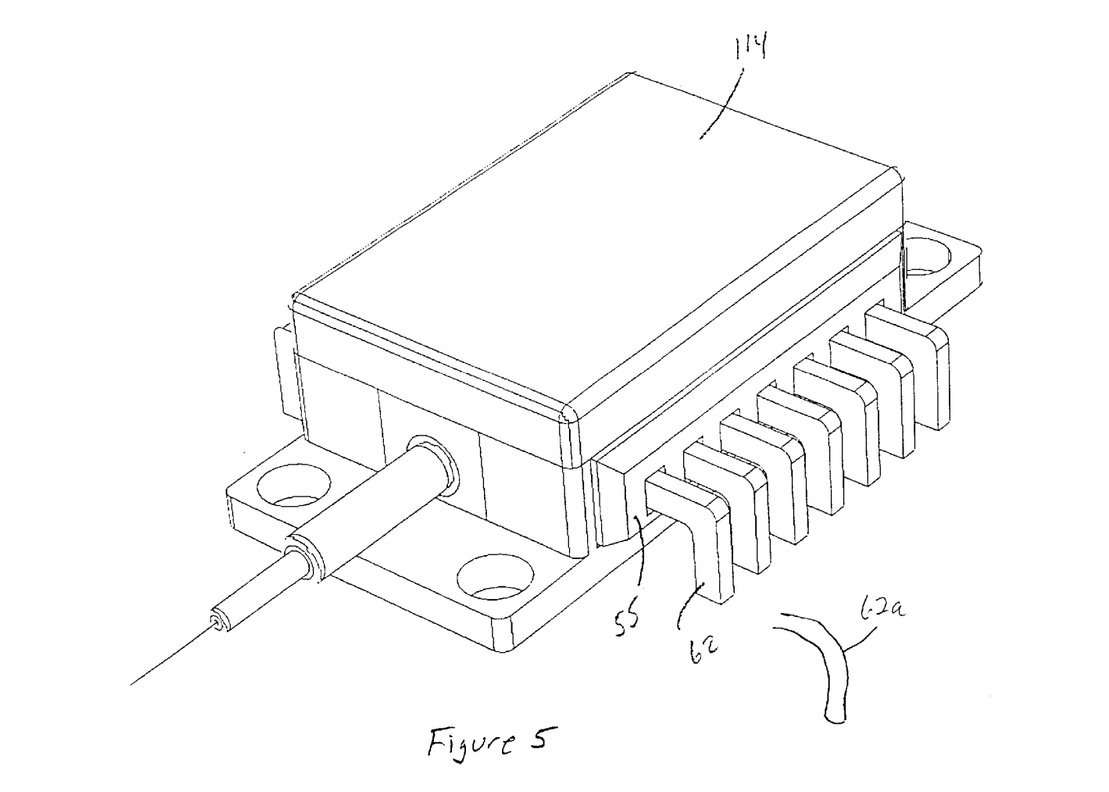
FIG. 5 is a schematic perspective view of a fully assembled first embodiment optoelectronic packaging assembly.

FIG. 5 shows a schematic perspective view of a fully assembled optoelectronic packaging assembly 50. As shown the external cover 114 mates with the remainder of the optoelectronic packaging assembly 50 so as to form a protected, sealed package. FIG. 5 also shows a sidewall 55 protruding from the remainder of the package. The sidewall could be integrated to the package or added as a secondary piece. While the pins 62 are shown with square cross-sections, in optoelectronic packaging assemblies produced at high speed it may be beneficial to use round openings and round pins 62a.

The optoelectronic packaging assembly 50 illustrated in FIGS. 2 through 5 is beneficial in addressing various limitations of the optoelectronic packaging assembly 20. However, the optoelectronic packaging assembly 50 may not be optimal in all applications. For example, in some applications might be beneficial to arrange for heat transfer through that top of the optoelectronic packaging assembly. One such optoelectronic packaging assembly is a second embodiment optoelectronic packaging assembly 200 illustrated in FIGS. 6 and 7. Such optoelectronic packaging assemblies are inverted structures in which heat flow is predominately through the top of the assembly.

Figure 6:
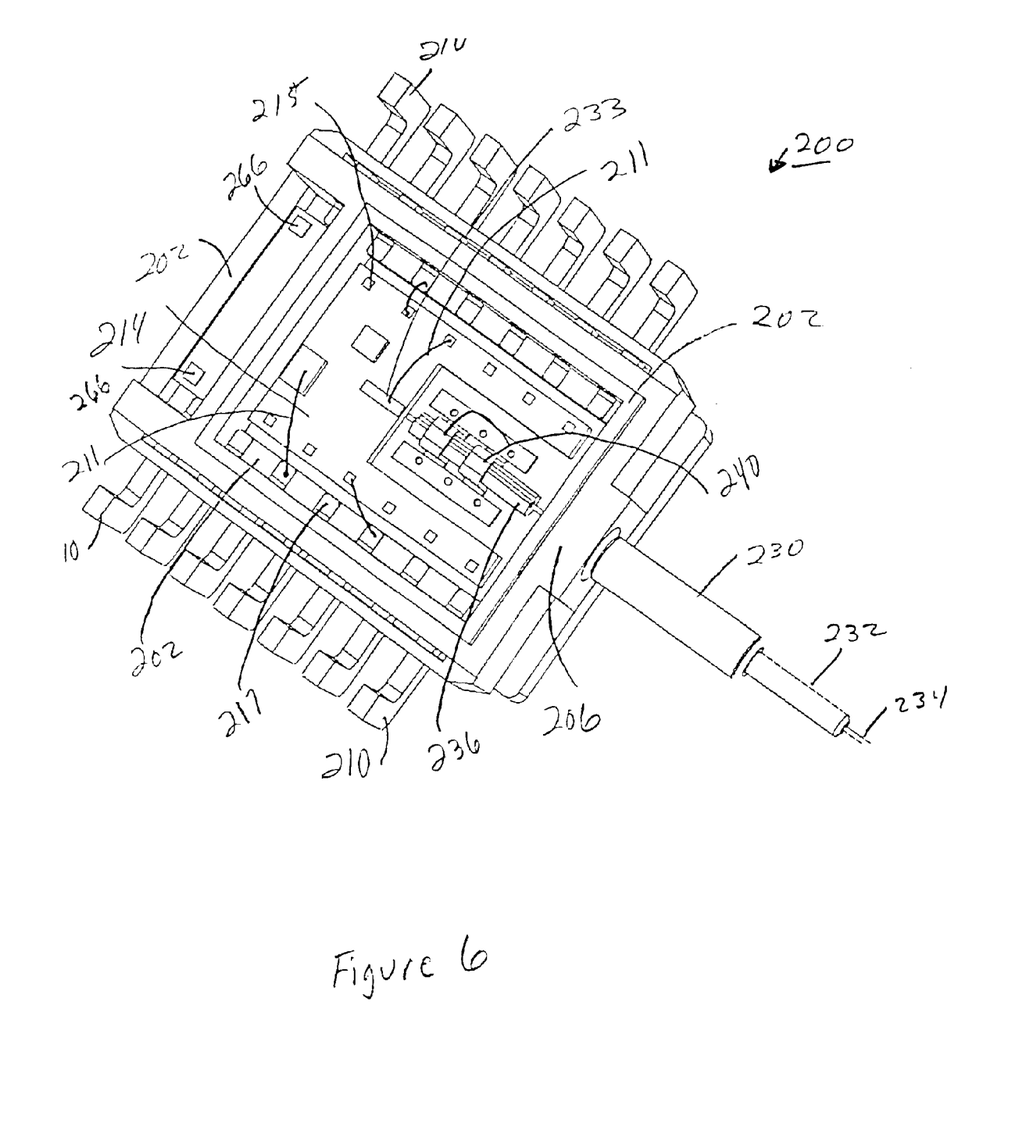
FIG. 6 is a bottom perspective view of a second embodiment optoelectronic packaging assembly that is in accord with the principles of the present invention, but without a bottom plate.
Figure 7:
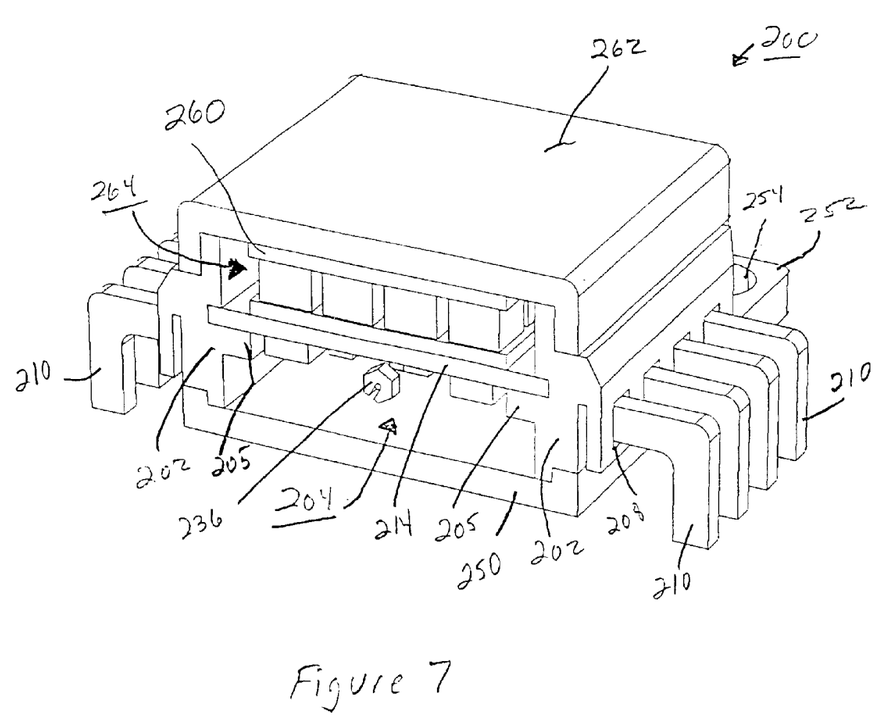
FIG. 7 is a cut-away perspective view of the second embodiment optoelectronic packaging assembly.

FIG. 6 illustrates a bottom view of the second embodiment optoelectronic packaging assembly 200 with a bottom cover removed, while FIG. 7 illustrates a cut-away view. In this embodiment, the device is inverted, or flipped over to increase thermal efficiency by allowing the heat to be evacuated through the top. As shown in those figures, the optoelectronic packaging assembly 200 includes a submount 202 having a cavity 204 that is partially defined by a front wall 206 (not shown in FIG. 7). Inside the cavity 204 are protrusions 205 (see FIG. 7). The submount 202 also includes a plurality of openings 208 for receiving a plurality of pins 210. Typically, the submount 202 is molded from a liquid crystal polymer (such as VECTRA), but may also contain plating such as gold, nickel or aluminum for shielding or sealing.

Furthermore, as shown in FIGS. 6 and 7, the openings 208 and the pins 210 have rectangular cross-sections (round cross-sections are an alternative). Beneficially, the pins 210 are insert molded into the submount 202, or are pushed into the openings 208. If the pins are pushed into the openings, the openings 208 are beneficially sealed with a sealant. In any event, the pins 210 are used to make electrical connections between external electronics and an internal optoelectronic component or assembly. Referring now to FIG. 6, to this end electrical conductors 211 are bonded between the pins 210 and the optoelectronic component or assembly. Furthermore, the pins 210 are beneficially formed into a "standard footprint" such that they can mount in the same location as the pins of the optoelectronic packaging assembly 20.

An optical bench (or substrate or printed circuit board) 214 holding an electro-optic device is mounted on the protrusions 205. Beneficially, the optical bench 214 includes contacts 215 to which the electrical conductors bond. Electrical connections are formed between the contacts 215 and exposed portions 217 of the pins 210. This enables electrical connections between external circuitry and components on the optical bench 214. Typically, the optical bench 214 is comprised of aluminum silicon carbide, copper tungsten, or a ceramic.

Referring now specifically to FIG. 6, the submount 202 includes an optical input receptacle 230 for receiving an optical ferrule 232 that mates with an optical fiber 234. The input receptacle 230 includes a "half-moon" shaped slot as described in more detail with respect to FIG. 10. The optical ferrule 232 is inserted through the input receptacle 230, while the optical fiber 234 is inserted into the optical ferrule. The optical ferrule 232 is optically aligned with the electro-optic device 233 such that an efficient optical transition is made between the electro-optic device 233 and the optical fiber 234. Assisting the optical alignment is an optical spacer 236. The optical spacer is configured to retain and hold the optical ferrule such that optical ferrule is located in the same plane as the electro-optic device. The optoelectronic packaging assembly 200 further includes clamps 240 for retaining the optical spacer 236.

Turning now to FIG. 7, the submount 202 is dimensioned to fit into a bottom cover 250. That bottom cover can include optional mounting flanges 252 having mounting holes 254 that are used for mounting the optoelectronic packaging assembly 200 to an external structure. Such optional mounting flanges are shown in FIG. 7, but not in FIG. 6. The bottom cover 250 is dimensioned to be received on surfaces of the submount 202. The bottom cover 250 is beneficially molded from a liquid crystal polymer (such as VECTRA) although other materials may be used. Furthermore, if used, the mounting holes 254 can be formed with a "standard footprint" such that the optoelectronic packaging assembly 200 can mount interchangeably with the optoelectronic packaging assembly 20. If space savings is required the flanges can be reduced in size or even eliminated.

Still referring specifically to FIG. 7, an optional thermal-electric-cooler 260 (TEC), that beneficially includes a Peltier element, can cool the optoelectronic device or assembly. In that case, a top cover 262 having a cavity 264 receives the thermal-electric-cooler 260. That top cover is beneficially comprised of aluminum, copper, or copper tungsten. The thermal-electric-cooler 260 beneficially includes connectors 266 (see FIG. 6) for receiving electrical power. Those connectors are electrically connected to pins 210 such that external power can drive the thermal-electric-cooler 260. If the optional thermal-electric-cooler 260 is not used, the top cover 262 does not have to include the cavity 264. Furthermore, the top cover 262 can then be brought into direct thermal communication with the electro-optic device to provide heat dissipation.

While the first and second embodiments of the present invention are beneficial, some applications require improved thermal dissipation without a thermal-electric-cooler. Such is provided by a third embodiment optoelectronic packaging assembly 300 illustrated in FIG. 8.

Figure 8:
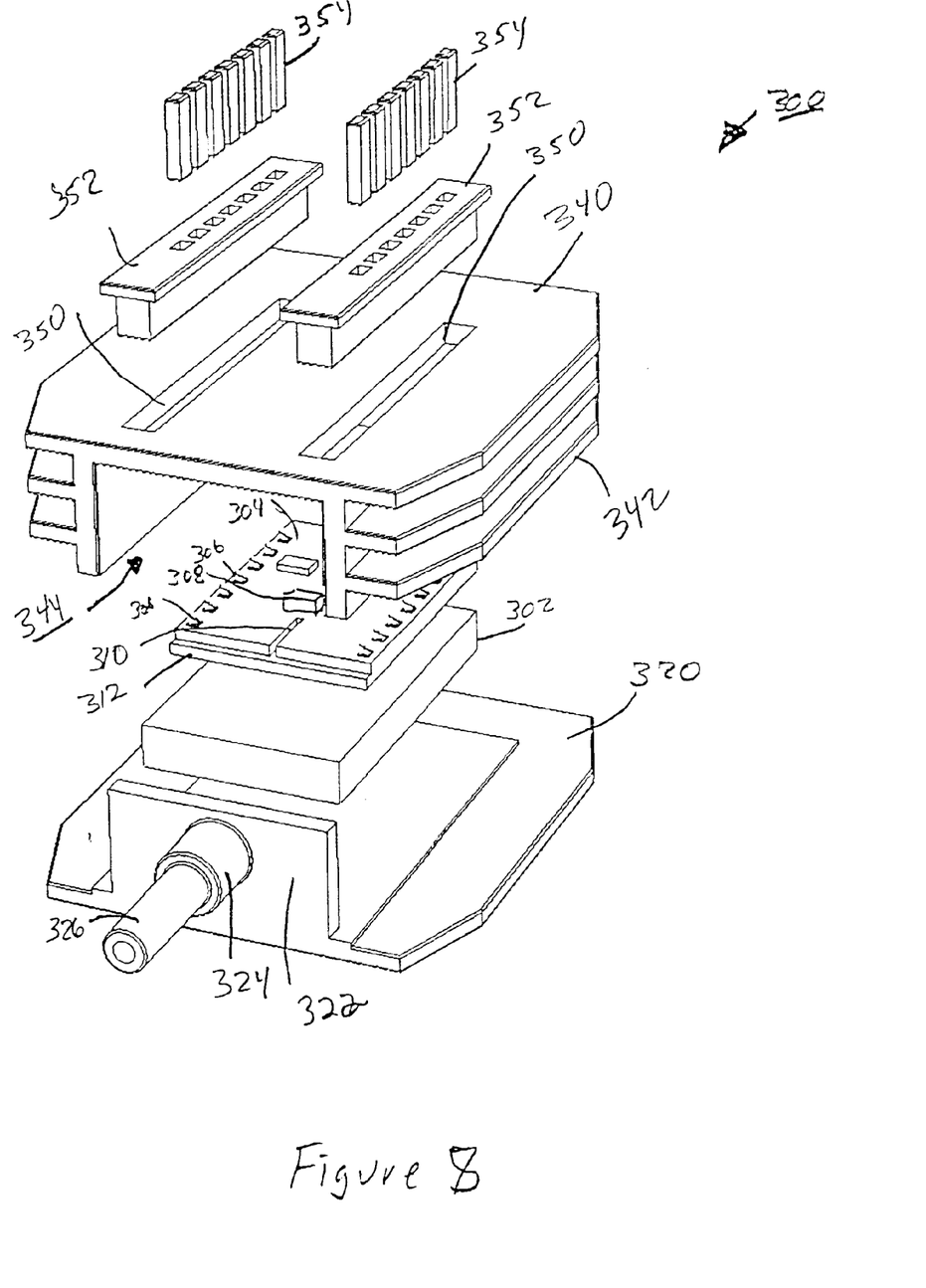
FIG. 8 is a blow-up of a third embodiment optoelectronic packaging assembly that is in accordance with the principles of the present invention.

As shown in FIG. 8, the optoelectronic packaging assembly 300 includes a submount 302 for receiving an optical bench 304 having a plurality of electrical contacts 306. The optoelectronic packaging assembly 300 is an inverted design, allowing the heat to escape from the top, and it utilizes a flipchip attachment to connect electrical signals between the optical bench 304 and the external final system. At least one optical component 308, beneficially an electro-optical device, is mounted on the optical bench 304. Also beneficially, the optical bench includes an alignment slot 310 for assisting optical alignment of the optical component 308 with an optical fiber (not shown in FIG. 8 for clarity). An optional spacer 312 can be disposed between the optical bench 304 and the submount 302 to assist optical alignment. Typically, the submount 302 is molded from a liquid crystal polymer (such as VECTRA), although other materials can also be used, and may also contain plating such as gold or nickel or aluminum for the purposes of shielding or sealing. The optical bench 304 is beneficially comprised of aluminum silicon carbide, copper tungsten, or a ceramic.

The submount 302 mounts on a base 320. That base includes a front wall 322 having an optical input receptacle 324. The optical input receptacle mates with an optical ferrule 326 that, in turn, mates with an optical fiber (not shown). The optical input receptacle 324 beneficially includes a "half-moon" shaped slot as described in more detail with respect to FIG. 10.

With the submount 302 fitted onto the base 320, the optical ferrule 326 is inserted through the input receptacle 324 and into the alignment slot 310 such that the input ferrule optically aligns with the electrical component 308. An optical spacer and clamps, such as those used in the first and second embodiments, can be used to retain the optical ferrule in position. Furthermore, the base 320 can include optional mounting flanges having mounting holes that can be used for mounting the optoelectronic packaging assembly 300 to an external structure. Such optional mounting flanges are not shown in FIG. 8. The base is beneficially molded from a liquid crystal polymer (such as VECTRA).

Still referring to FIG. 8, a heat-sink 340 having fins 342 and a cavity 344 is fitted over the base 320 and over the printed circuit board 304. The heat-sink 340 is beneficially dimensioned to thermally contact the optoelectrical component 308 and/or the optical bench when the optoelectronic packaging assembly 300 is fully assembled. To that end, the heat sink is beneficially comprised of aluminum, copper, aluminum silicon carbide, copper tungsten, or a ceramic. If desired, an optional thermal-electric-cooler (TEC) can be fitted in the cavity 344 to provide additional cooling. In that case, the cavity 344 is fabricated to receive the thermal-electric-cooler. However, FIG. 8 illustrates an optoelectronic packaging assembly 300 without a TEC.

Still referring to FIG. 8, the heat-sink 340 includes slots 350 for receiving molded inserts 352 that retain pins 354. The pins enable an electrical interface between the optical bench and the external environment. The slots, molded inserts 352 and pins 354 are dimensioned such that the pins 354 contact the electrical contacts 306. An electrically conductive paste or solder balls can be used to ensure electrical connections between the pins 354 and the electrical contacts 306. The pins 354 provide an electrical path between external devices and the electrical component 308.

Figure 9:
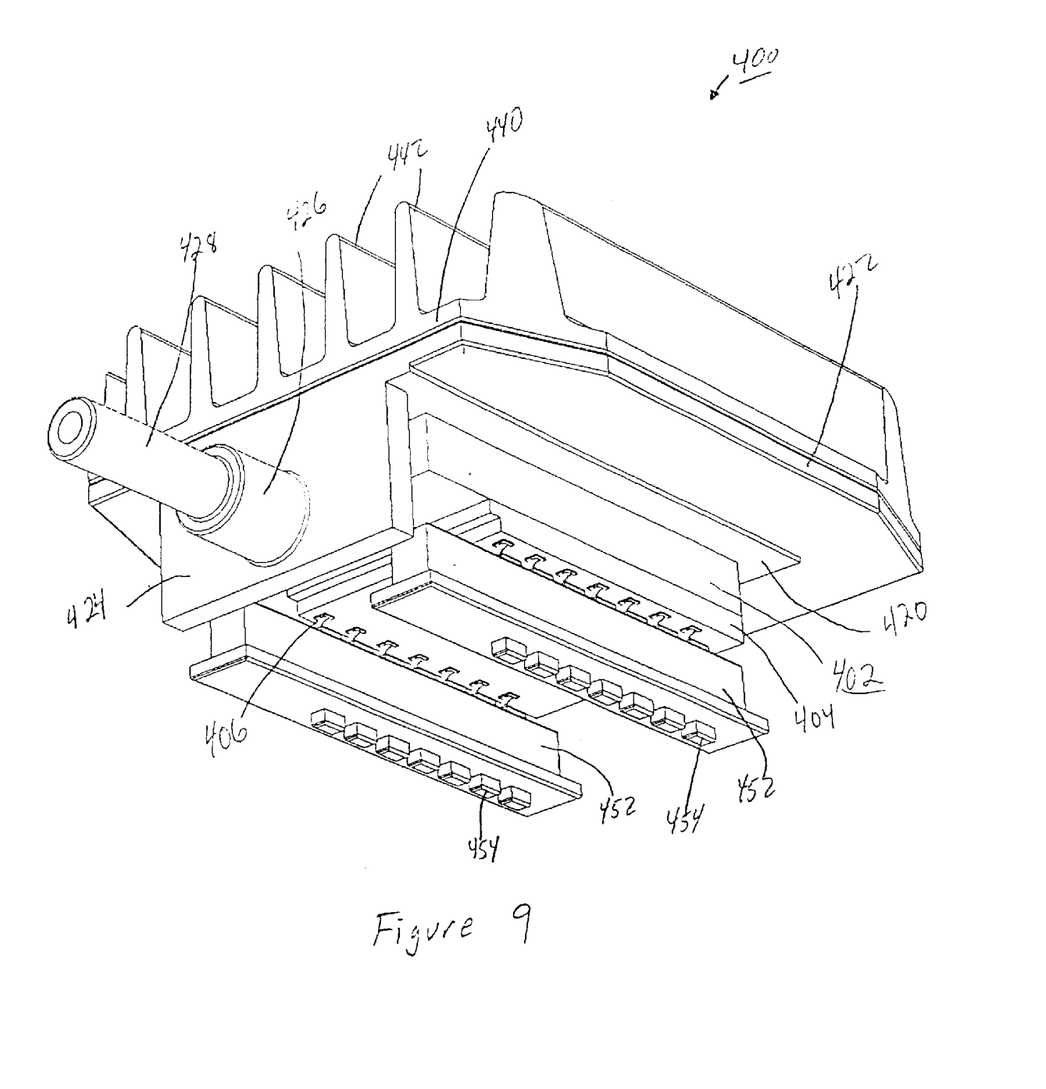
FIG. 9 is a blow-up of a fourth embodiment optoelectronic packaging assembly that is in accord with the principles of the present invention.

Another embodiment optoelectronic packaging assembly that provides improved thermal dissipation without a thermal-electric-cooler is a fourth embodiment "flip-chip" optoelectronic packaging assembly 400 illustrated in FIG. 9. As shown, the optoelectronic packaging assembly 400 includes a submount 402 for receiving an optical bench 404 having a plurality of electrical contacts 406. At least one electrical component, beneficially an electro-optical device, is mounted on the optical bench 404. As shown, the optical bench 304 is "flipped" over to enable better heat flow to the submount 402. Beneficially, the optical bench is comprised of aluminum silicon oxide, copper tungsten, or a ceramic, while the submount 402 is comprised of a highly thermally conductive material (such as copper, aluminum, or diamond).

The submount 402 mounts onto a plate 420 of a base 422. The base and the plate are beneficially comprised of a highly thermally conductive material, such as copper, copper tungsten, aluminum, or diamond. The base 422 has a front wall 424 with a protruding optical input receptacle 426. The optical input receptacle 426 mates with an optical ferrule 428 that, in turn, mates with an optical fiber (not shown). The optical input receptacle 426 beneficially includes a "half-moon" shaped slot as described in more detail with respect to FIG. 10.

With the submount 402 on the plate 420, the optical ferrule 428 is inserted through the optical input receptacle 426 such that the optical ferrule optically aligns with the electrical component. An optical spacer and clamps, such as those used in the first and second embodiments, can be used to retain the optical ferrule in position.

Still referring to FIG. 9, a heat-sink 440 having fins 442 mounts over the base 422. The heat-sink 440 is fabricated to transfer heat from the optoelectronic package 400 to the external environment. Beneficially, the heat sink is comprised of a highly thermally conductive material, such as copper, copper tungsten, aluminum, or diamond. If desired, an optional thermal-electric-cooler (TEC) can be disposed between the heat-sink 440 and the base 422.

The optoelectronic packaging assembly 400 also includes a bottom cover (which is removed for clarity) that includes slots for receiving molded inserts 452 that retain pins 454. The bottom cover, slots, molded inserts 452, and pins 454 are dimensioned such that the pins 454 contact the electrical contacts 406. An electrically conductive paste or solder balls can be used to ensure electrical connections between the pins 454 and the electrical contacts 406. The pins provide an electrical path between external devices and the electrical component.

Figure 10:
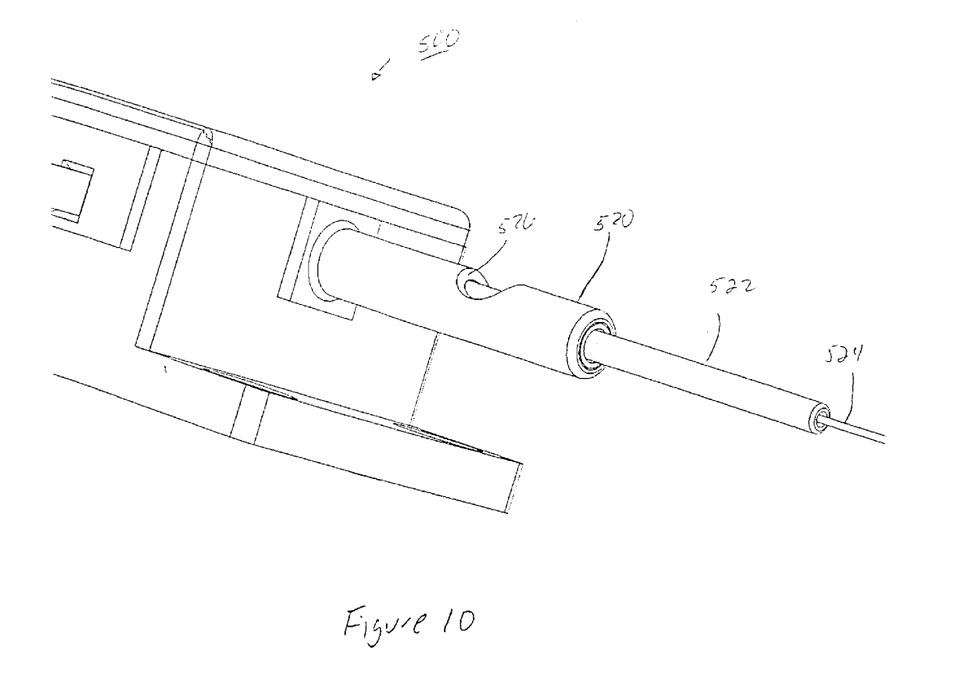
FIG. 10 is a perspective view of a retaining feature this is beneficially included in the first through fourth embodiment optoelectronic packaging assemblies.

All of the illustrated embodiments include an optical input receptacle that receives an optical ferrule. FIG. 10 illustrates a generalized optoelectronic packaging assembly 500 that includes an optical input receptacle 520 that receives an optical ferrule 522. An optical fiber 524 fits into the optical ferrule 522 shown in the exploded view for clarity. Furthermore, the optical input receptacle 520 includes a half-moon shaped slot 526. This slot enables an assembly operator to seal the optical ferrule 522 in place in the optical input receptacle 520. This prevents the optical ferrule 522 from moving after assembly that could potentially damage the laser or create signal integrity problems related to misalignment of the fiber. Beneficially, after the optical ferrule is aligned with an electro-optic device within the optoelectronic packaging assembly 500, an operator places a sealant, such as an epoxy in the moon shaped slot 526. The sealant then seals the input receptacle 520 while retaining the optical ferrule 522 in position.

It will be apparent to those skilled in the art that various modifications and variation can be made in the present invention without departing from the spirit or scope of the invention. Thus, it is intended that the present invention covers the modifications and variations of this invention provided they come within the scope of the appended claims and their equivalents.

What is claimed is:

1. An optoelectronic packaging assembly, comprising:
   a submount having a cavity defined by a floor, sidewalls, a back wall, and a front wall, wherein at least one of said sidewalls retains pins, said submount further including an optical input receptacle which extends from said front wall;
   a base having sidewalls with top surfaces and a front wall with a slot, wherein said base is configured to receive said submount such that said submount extends over said sidewalls of said base and such that said optical input receptacle extends from said slot; and
   an external cover over said submount.

2. An optoelectronic packaging assembly according to claim 1, wherein said pins have rectangular cross-sections.

3. An optoelectronic packaging assembly according to claim 1, wherein said pins have round cross-sections.

4. An optoelectronic packaging assembly according to claim 1, wherein said pins are insert molded in said submount.

5. An optoelectronic packaging assembly according to claim 1, further including a raised mount in said cavity.

6. An optoelectronic packaging assembly according to claim 5, further including an electro-optical device on said raised mount.

7. An optoelectronic packaging assembly according to claim 1, wherein said optical input receptacle includes a half-moon shaped slot.

8. An optoelectronic packaging assembly according to claim 1, wherein said base includes a mounting flange having a mounting hole.

9. An optoelectronic packaging assembly according to claim 1, wherein said submount rests on said top surfaces.

10. An optoelectronic packaging assembly according to claim 1, wherein said optical input receptacle extends from a block structure on said front wall of said submount, and wherein said block structure is received in said slot of said front wall of said base.

11. An optoelectronic packaging assembly according to claim 1, further including a thermal-electric-cooler disposed between said submount and said base.

12. An optoelectronic packaging assembly according to claim 11, wherein said thermal-electric-cooler fits into a cavity in said base.

13. An optoelectronic packaging assembly according to claim 12, wherein said thermal-electric-cooler receives electrical power through said pins.

14. An optoelectronic packaging assembly according to claim 1, further including a lower cover inside said submount.

15. An optoelectronic packaging assembly according to claim 1, further including an optical ferrule in said optical fiber input receptacle.

16. An optoelectronic packaging assembly according to claim 15, further including an optical fiber inserted into said optical ferrule.

17. An optoelectronic packaging assembly according to claim 16, further including an electro-optical device in said optoelectronic packaging assembly that is optically coupled to said optical fiber.

18. An optoelectronic packaging assembly according to claim 17, further including an optical spacer that assists said optical coupling.

19. An optoelectronic packaging assembly according to claim 18, further including clamps for clamping said optical spacer.

20. An optoelectronic packaging assembly according to claim 18, wherein said electro-optical device is on an optical bench that includes an alignment slot for assisting optical alignment of the electro-optical device with said optical fiber.

21. An optoelectronic packaging assembly according to claim 20, further including conductors between said pins and said optical bench.

22. An optoelectronic packaging assembly according to claim 1, wherein said submount includes a liquid crystal polymer.

23. An optoelectronic packaging assembly according to claim 1, wherein said submount includes a metal.

24. An optoelectronic packaging assembly, comprising:
   a submount having sidewalls, a front wall, pins, protrusions, and an optical input receptacle, wherein said protrusions are dimensioned to receive an optical bench, wherein said walls define a cavity, wherein said walls retain said pins, and wherein said optical input receptacle extends from said front wall;
   a bottom cover having walls configured to receive said submount such that said submount and said bottom cover form an enclosed bottom cavity, and such that said optical input receptacle extends from said bottom cavity; and a top cover configured to be received on said submount such that said submount and said top cover form an enclosed top cavity.

25. An optoelectronic packaging assembly according to claim 24, wherein said bottom cover includes a mounting flange having a mounting hole.

26. An optoelectronic packaging assembly according to claim 24, wherein said pins have rectangular cross-sections.

27. An optoelectronic packaging assembly according to claim 24, wherein said pins have circular cross-sections.

28. An optoelectronic packaging assembly according to claim 24, wherein said pins are insert molded in said submount.

29. An optoelectronic packaging assembly according to claim 24, wherein said optical input receptacle includes a half-moon shaped slot.

30. An optoelectronic packaging assembly according to claim 24, further including a thermal-electric-cooler disposed in said top cavity.

31. An optoelectronic packaging assembly according to claim 30, wherein said thermal-electric-cooler is electrically connected to at least one of said pins.

32. An optoelectronic packaging assembly according to claim 24, further including an optical bench on said protrusions.

33. An optoelectronic packaging assembly according to claim 32, further including an electro-optic device on said optical bench.

34. An optoelectronic packaging assembly according to claim 33, further including an optical ferrule in said optical fiber input receptacle.

35. An optoelectronic packaging assembly according to claim 34, further including an optical fiber inserted in said optical ferrule.

36. An optoelectronic packaging assembly according to claim 35, wherein said electro-optic device is optically coupled to said optical fiber.

37. An optoelectronic packaging assembly according to claim 36, further including an optical spacer that assists said optical coupling.

38. An optoelectronic packaging assembly according to claim 33, wherein said electro-optical device is disposed adjacent said bottom cover.

39. An optoelectronic packaging assembly according to claim 38, wherein said pins include exposed contact surfaces inside said optoelectronic packaging assembly, and further including conductors electrically connecting said optical bench to said exposed contact surfaces.

40. An optoelectronic packaging assembly according to claim 24, wherein said pins include exposed contact surfaces inside said optoelectronic packaging assembly.

41. An optoelectronic packaging assembly according to claim 24, wherein said submount includes a liquid crystal polymer.

42. An optoelectronic packaging assembly according to claim 24, wherein said submount includes a metal.

43. An optoelectronic packaging assembly, comprising:

a base having a bottom wall and a front wall with a protruding optical input receptacle;

a submount attached to said bottom wall; and a heat-sink that mates with said base to form an enclosed volume, said heat-sink including a top surface with a slot; and an insert in said slot, said insert including pins that extend into said enclosed volume.

44. An optoelectronic packaging assembly according to claim 43, wherein said heat-sink includes cooling fins.

45. An optoelectronic packaging assembly according to claim 43, wherein said pins have rectangular cross-sections.

46. An optoelectronic packaging assembly according to claim 43, wherein said pins have circular cross-sections.

47. An optoelectronic packaging assembly according to claim 43, wherein said pins are insert molded in said insert.

48. An optoelectronic packaging assembly according to claim 43, wherein said optical input receptacle includes a half-moon shaped slot.

49. An optoelectronic packaging assembly according to claim 43, further including an optical bench on said submount.

50. An optoelectronic packaging assembly according to claim 49, further including an electro-optical device on said optical bench.

51. An optoelectronic packaging assembly according to claim 50, wherein said optical bench includes an alignment slot.

52. An optoelectronic packaging assembly according to claim 51, further including an optical ferrule in said optical fiber input receptacle.

53. An optoelectronic packaging assembly according to claim 52, further including an optical fiber inserted into said optical ferrule.

54. An optoelectronic packaging assembly according to claim 53, wherein said electro-optical device is optically coupled to said optical fiber.

55. An optoelectronic packaging assembly according to claim 50, wherein said optical bench includes a plurality of contacts in electrical contact with said pins.

56. An optoelectronic packaging assembly according to claim 43, wherein said submount includes a liquid crystal polymer.

57. An optoelectronic packaging assembly according to claim 43, wherein said submount includes a metal.

58. An optoelectronic packaging assembly according to claim 50, wherein said electro-optical device is disposed on said optical bench opposite said submount.

59. An optoelectronic packaging assembly, comprising:

a base having a plate and a front wall with an optical input receptacle;

a submount on said plate;

an optical bench on said submount, said optical bench including a plurality of electrical contacts;

a heat-sink in thermal communication with said plate; and an insert with pins that electrically connect to said plurality of electrical contacts, wherein said pins are insert molded in said insert.

60. An optoelectronic packaging assembly according to claim 59, wherein said heat-sink includes cooling fins.

61. An optoelectronic packaging assembly according to claim 59, wherein said pins have rectangular cross-sections.

62. An optoelectronic packaging assembly according to claim 59, wherein said pins have circular cross-sections.

63. An optoelectronic packaging assembly according to claim 59, wherein said optical input receptacle includes a half-moon shaped slot.

64. An optoelectronic packaging assembly according to claim 59, further including an optical ferrule in said optical fiber input receptacle.

65. An optoelectronic packaging assembly according to claim 64, further including an optical fiber inserted into said optical ferrule.

66. An optoelectronic packaging assembly according to claim 59, further including an electro-optical device on said optical bench.

67. An optoelectronic packaging assembly according to claim 66, wherein said electro-optical device is disposed on said optical bench opposite said submount.

68. An optoelectronic packaging assembly according to claim 67, where in said electro-optical device is optically coupled to said optical fiber.

69. An optoelectronic packaging assembly according to claim 59, wherein said submount includes a liquid crystal polymer.

70. An optoelectronic packaging assembly according to claim 59, wherein said submount includes a metal.

71. An optoelectronic packaging assembly, comprising:

a base having a plate and a front wall with an optical input receptacle;

a submount on said plate, wherein said submount includes a liquid crystal polymer;

an optical bench on said submount, said optical bench including a plurality of electrical contacts;

a heat-sink in thermal communication with said plate; and an insert with pins that electrically connect to said plurality of electrical contacts.

* * * * *